(12) United States Patent
Beierlein et al.

(10) Patent No.: US 7,122,254 B2
(45) Date of Patent: Oct. 17, 2006

(54) INORGANIC ELECTRODE FOR ORGANIC ELECTROLUMINESCENT DEVICES

(75) Inventors: Tilman A. Beierlein, Kilchberg (CH); Jean Fompeyrine, Waedenswil (CH); Eliav Haskal, Eindhoven (NL); Heike Riel, Rueschlikon (CH); Walter Riess, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 09/970,873

(22) Filed: Oct. 3, 2001

(65) Prior Publication Data
US 2002/0045066 A1 Apr. 18, 2002

(30) Foreign Application Priority Data
Oct. 2, 2000 (EP) .................... 00121587

(51) Int. Cl.
H05B 33/00 (2006.01)
H01L 51/50 (2006.01)
B32B 15/04 (2006.01)

(52) U.S. Cl. .................. 428/469; 428/690; 428/917; 313/504; 313/506; 252/518.1; 252/521.2; 252/519.4

(58) Field of Classification Search ............. 428/690, 428/469, 917; 313/504, 505, 506; 427/66, 427/126.1; 252/518.1, 521.2, 519.4
See application file for complete search history.

(56) References Cited

U.S. PATENT DOCUMENTS

| | | | | |
|---|---|---|---|---|
| 4,235,241 A * | 11/1980 | Tabuchi et al. | ............ | 600/396 |
| 4,426,428 A * | 1/1984 | Kammer et al. | ............ | 428/561 |
| 4,735,875 A * | 4/1988 | Anderman et al. | ......... | 429/217 |
| 5,362,580 A * | 11/1994 | Ferrando et al. | ............ | 429/245 |
| 5,505,985 A * | 4/1996 | Nakamura et al. | ............ | 427/66 |
| 5,608,287 A * | 3/1997 | Hung et al. | .................. | 313/503 |
| 5,677,572 A | 10/1997 | Hung et al. | .................. | 257/750 |
| 5,776,622 A * | 7/1998 | Hung et al. | .................. | 428/690 |
| 5,776,623 A | 7/1998 | Hung et al. | .................. | 428/690 |
| 6,060,195 A * | 5/2000 | Shinyama et al. | .......... | 429/223 |
| 6,121,727 A * | 9/2000 | Kanai et al. | ................. | 313/504 |
| 6,200,695 B1 * | 3/2001 | Arai et al. | ................... | 428/690 |
| 6,281,627 B1 | 8/2001 | Arai et al. | | |
| 6,395,409 B1 * | 5/2002 | Ueda et al. | .................. | 428/690 |
| 6,475,664 B1 * | 11/2002 | Kawakami et al. | ......... | 429/137 |
| 6,525,466 B1 * | 2/2003 | Jabbour et al. | ............. | 313/504 |
| 6,630,257 B1 * | 10/2003 | Ye et al. | ...................... | 428/698 |
| 2002/0117962 A1* | 8/2002 | Beierlein et al. | ........... | 313/504 |
| 2002/0197765 A1* | 12/2002 | Barth et al. | .................... | 438/82 |

FOREIGN PATENT DOCUMENTS

EP 1020938 A2 * 7/2000
JP 51-025740 A * 3/1976

* cited by examiner

Primary Examiner—Dawn Garrett
(74) Attorney, Agent, or Firm—Manny Schecter; David Aker

(57) ABSTRACT

An electrode comprises an inorganic composite layer of a mixture of at least one insulating inorganic material and at least one at least partially conducting inorganic material. In an application of such an electrode, an organic electroluminescent device comprises a first and second conductor layers. An organic layer is disposed between the first and second conductor layers. The aforementioned composite layer is disposed between the organic layer and the first conductor layer. Methods of fabricating such an electrode and such a device are also described.

34 Claims, 4 Drawing Sheets

INORGANIC ELECTRODE FOR ORGANIC ELECTROLUMINESCENT DEVICES

FIELD OF THE INVENTION

The present invention generally relates to inorganic electrodes for organic electroluminescent devices.

BACKGROUND ART

There is continuing interest in developing electroluminescent devices, such as light emitting diodes, based on organic materials. The primary motivation for this continuing interest is that many organic materials have high fluorescence quantum efficiencies in the visible spectrum, an thus have significant potential for colour display applications. U.S. Pat. No. 5,608,287 describes an example of a typical organic light emitting diode (OLED). Such a device usually comprises a first electrode layer disposed on a substrate, at least one organic layer disposed on the first electrode layer, and a second electrode layer disposed on the organic layer. In operation, a voltage is applied across the organic layer via the electrodes. One of the electrodes (the cathode) injects electrons into the organic layer. The other electrode (the anode) injects holes into the organic layer. Radiative recombination of the oppositely charged carriers produces photon emissions from the device.

The anode is preferably fabricated from a material with a relatively high work function in the interests of providing effective hole injection. Because light has to be transferred out of the device efficiently, it is desirable for at least one of the electrodes to be transparent. In most conventional applications, light is transferred through a transparent anode. Such anodes typically consist of Indium Tin Oxide (ITO) having a work function in the range of 4.2 to 4.8 eV, Zinc Oxide, or Aluminium doped Zinc Oxide. To optimise device performance, the cathode is preferably formed from a material having a relatively low work function preferably aligned to the electron affinity of the organic layer. U.S. Pat. No. 5,677,572 and U.S. Pat. No. 5,776,623 describe multi-layer electrode structures in which different functional layers are stacked to provide a collective effect.

SUMMARY OF THE INVENTION

In accordance with the present invention, there is now provided an electrode comprising an inorganic composite layer of a mixture of at least one insulating inorganic material and at least one at least partially conducting inorganic material.

This differs from conventional multi-layer electrode structures in which such materials are segregated into discrete layers. Instead, in embodiments of the present invention, at least one insulating inorganic material is mixed with at least one at least partially conducting inorganic material in a modifiable combination. The or each insulating material has energy levels for facilitating efficient injection of charge carriers. In an anode configuration, such charge carriers comprise holes. However, in a cathode configuration, such charge carriers comprise electrons. The at least partially conducting material effectively renders the composite layer at least partially conducting. The composite layer may be regarded as composed of at least one insulating or semiconducting inorganic material and at least one semiconducting or metallic inorganic material.

The insulating material and at the at least partially conducting material may comprise oxide, fluoride, chloride, bromide, iodides, or sulphide, hydroxide, sulphite, sulphate, or carbonate, for example. In an anode configuration, the composite layer preferably has an average work function greater than 4 eV. In a cathode configuration, the composite layer preferably has an average work function less than 4 eV. The composite layer preferably has a resistivity lower than 1000 Gigaohm-meters. Preferably, the grain length of the materials of the composite layer is greater than 1 nanometer. Preferred examples of electrodes embodying the present invention also comprise a conductive layer. The conductive layer may comprise a metal such as Nickel, Tungsten or Cobalt or the like. Equally, alloys of such metals could be employed. Similarly, semimetals such as graphite, intrinsic or doped semiconductor materials or conductive organic materials could be used.

The present invention extends to a device comprising a substrate and an electrode as herein before described.

For example, in a particularly preferred embodiment of the present invention, there is provided an organic electroluminescent device comprising: first and second conductor layers; an organic layer disposed between the first and second conductor layers; and a composite layer disposed between the organic layer and the first conductor layer, the composite layer comprising a mixture of at least one insulating inorganic material and at least one at least partially conducting inorganic material. The device may comprise a substrate. The first conductor layer may be disposed between the substrate and the organic layer. Alternatively, the second conductor layer may be disposed between the substrate and the organic layer. In another preferred embodiment of the present invention, there is provided an organic electroluminescent device comprising: a first and second conductor layers; an organic layer disposed between the first and second conductor layers; a first composite layer disposed between the organic layer and the first conductor layer, and a second composite layer disposed between the organic layer and the second conductor layer, the first and second composite layers each comprising a mixture of at least one insulating inorganic material and at least one at least partially conducting inorganic material. A performance enhancing layer may be disposed between the first conductor layer and the first organic layer. The performance enhancing layer may be light reflective. Alternatively, the performance enhancing layer may be light absorbent. The first conductor layer may form part of an anode. Alternatively, the first conductor layer may forms part of a cathode. In the interests of optimising performance of the device, the or each composite layer preferably comprises a region adjacent the organic layer in which region the at least partially conducting material is depleted.

Viewing the present invention from another aspect, there is now provided a method of fabricating an electrode comprising the step of forming an inorganic composite layer of a mixture of an insulating inorganic material and an at least partially conducting inorganic material. The forming step may comprise forming the composite layer on a conductive layer. The forming step may also comprise exposing the conductive layer to a precursor. The precursor may comprise Hydrogen or water, for example. The forming step may comprise exposing the conductive layer to a surface treatment, such as oxygen plasma treatment, Ultra Violet (UV)-Ozone treatment, ion bombardment, and ion implantation. The method may also comprise the step of adjusting the ratio of the insulating material to the at least partially conducting material in the mixture. The adjusting step may comprise a quantitative measurement of precursor amount. The adjusting step may comprise exposing the composite layer to a surface treatment such as oxygen plasma treatment UV-ozone treatment, ion bombardment, ion implantation, irradiating the composite layer with X rays, and, etching the composite layer with an etchant for depleting one of the materials in the mixture. The present invention also extends to a method for fabricating an organic electroluminescent device comprising fabricating an electrode as herein before described.

BRIEF DESCRIPTION OF THE DRAWINGS

Preferred embodiments of the present invention will now be described, by way of example only, with reference to the accompanying drawings, in which.

DETAILED DESCRIPTION OF THE INVENTION

Figure 1:
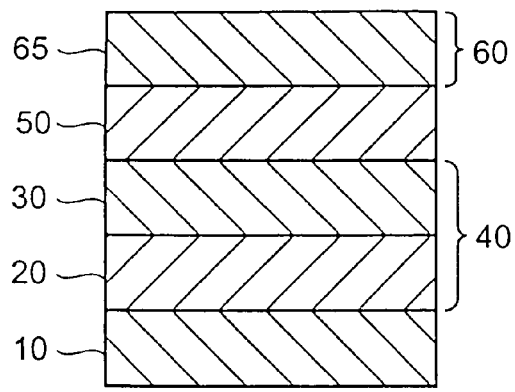
FIG. 1 is a cross-sectional view of an example of an OLED embodying the present invention.

Referring first to FIG. 1, an OLED embodying the present invention comprises an anode 40 disposed on a substrate 10. The substrate 10 comprises a single crystal semiconductor. In other embodiments of the present invention, the substrate may comprise glass, plastic foils, ceramic, and the like. Examples of suitable semiconductor materials for implementing the substrate include Silicon, Germanium, and Gallium Arsenide. An organic layer 50 is disposed on the anode 40. In other embodiments of the present invention, there may be multiple organic layers disposed on the anode 40. A cathode 60 is disposed on the organic layer 50. The cathode 60 may be transparent and may comprise a conductive layer 65. The conductive layer 65 may be formed from low work function metals, alloys of such metals, or from Indium Tin Oxide, Zinc Oxide, or the like in combination with organic and inorganic injection layers. In operation, a voltage is applied across the organic layer 50 via the anode 40 and the cathode 60. The cathode 60 injects electrons into the organic layer. Similarly, holes are injected into the organic layer 50 by the anode 40.

The anode 40 comprises a conductive layer 20 disposed on the substrate 10 and a composite inorganic layer 30 disposed between the conductive layer 20 and the organic layer 50. Examples of materials suitable for implementing the conductive layer 20 include metals, semimetals such as graphite, conductive polymers, chemically doped organic layers and doped semiconductors. Particularly suitable materials for implementing the conductive layer 20 include, without limitation, Nickel, Tungsten, Silicon, Molybdenum, Cobalt, Silver Aluminium, and Graphite.

Figure 2:
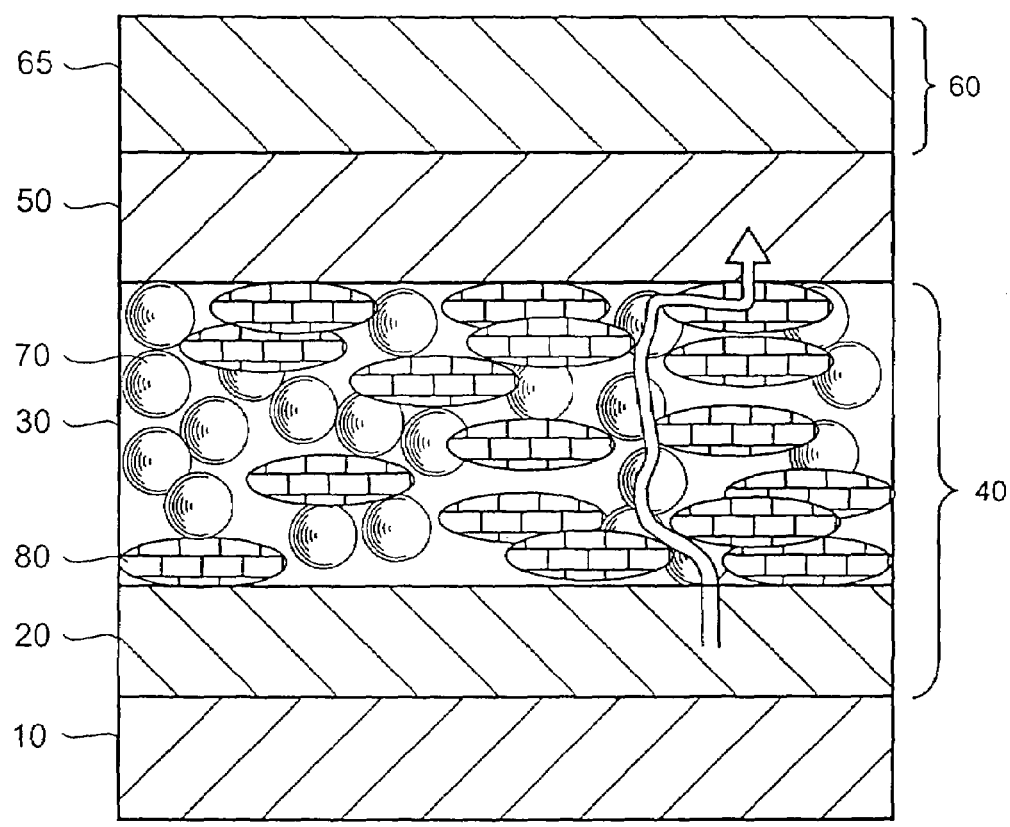
FIG. 2 is a cross-sectional view of part of another example of an OLED embodying the present invention.

Referring to FIG. 2, the composite layer 30 comprises at least one first, inorganic insulating component 80 and one or more second, at least semiconducting, inorganic components 70. The first component 80 provides a sufficiently high work function to permit effective injection of holes into the organic layer 50. The second component 70 makes the composite layer 30 at least partially conducting.

An example of an OLED embodying the present invention was constructed in the following manner. First, a conductive layer 20 of Nickel was deposited on a silicon substrate 10. The Nickel layer 20 was exposed to a precursor and then exposed to an oxygen plasma. Examples of suitable precursors include Hydrogen and water. The exposure of the Nickel to the oxygen plasma created a relatively thick layer 30 composed of a mix of Nickel Hydroxide and Nickel Oxide on the surface of the Nickel. In this example, the Nickel Oxide provides the first component 80 of the composite layer 30 and the Nickel Hydroxide provides the second component 70 of the composite layer 30.

Nickel is not an efficient hole-injecting material. However, Nickel Oxide is suitable for hole injection into organic materials. This is because Nickel Oxide is an insulating oxide having a relatively high ionisation potential. Nickel Hydroxide is a semi-insulating material having a resistivity of approximately 10 Gigaohm centimeters. Tests indicate that Nickel Hydroxide is not suitable for hole injection into organic materials. This may be due to the relatively low ionisation potential of Nickel Hydroxide. Deposition of a relatively thick layer of insulating material such as Nickel Oxide on the conductive layer 20 reduces device efficiency, because the insulating material presents a barrier to charge flow. Tests indicate that deposition of relatively thin (about 1 nm) insulating layers of Lithium Fluoride (LiF) or Vanadium oxide films on the conductive layer 30 provide more efficient devices. However, it is difficult to make such layers at the desired thickness in a high volume manufacturing environment. The conductivity of the composite layer is increased by chemical interaction between the Nickel Oxide and Nickel Hydroxide. This permits efficient hole injection without introducing an insulating barrier. Referring to FIG. 2, the path of hole current when an electric field is applied across the OLED is illustrated by the arrow. The holes follow the path of least resistance to current flow. Initially, this path passes through conducting paths provided by the Nickel Hydroxide and/or conducting paths provided by the interaction between the Nickel Hydroxide and the Nickel Oxide. However, at the interface between the organic layer and the composite layer 30, the path passes instead through the Nickel Oxide. This is because Nickel Oxide has a relatively high ionisation potential and therefore presents no significant barrier to holes entering the organic layer. Charge flows from the composite layer 30 into the organic layer 50 via those domains offering the lowest barrier. Preferred performance in terms of hole injection is obtained if the domain sizes of the first and second components of the composite layer 30 are relatively small (in the range of nanometers) and there is sufficient material having a high ionisation potential at the interface between the composite layer 30 and the organic layer 50.

Figure 3:
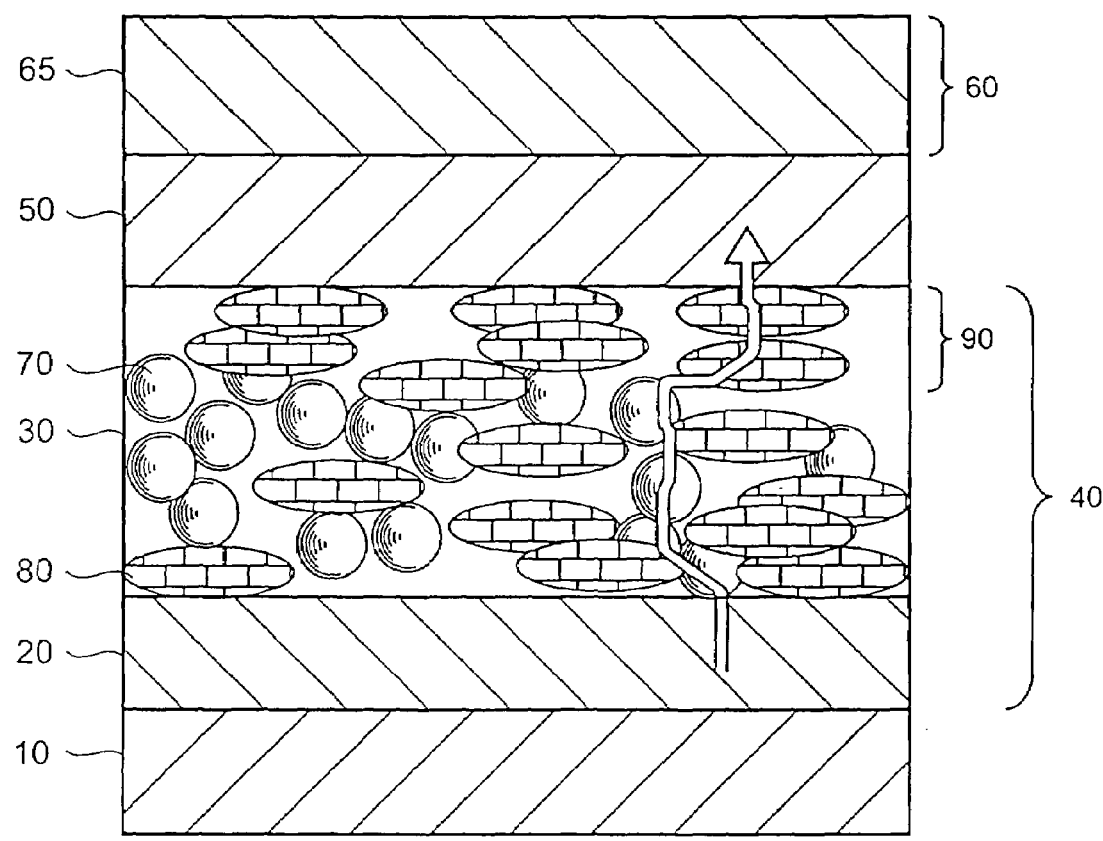
FIG. 3 is a cross-sectional view of a modification of the OLED illustrated in FIG. 2.

Referring now to FIG. 3, in a modification of the example of the present invention herein before described, a region 90 of the composite layer 30 adjacent to the organic layer 50 is made rich in Nickel Oxide by Hydroxide depletion. Such Hydroxide depletion may be brought about by exposing the surface of the composite layer 30 to surface treatments such as oxygen plasma, Ultraviolet (UV) Ozone and the like.

The current carrying characteristics of the composite layer 30 allow the composite layer 30 to cover a range of thickness from the nanometer scale to relatively thick layers (e.g.: in the region 90 of several micro meters) without degrading device performance.

As mentioned earlier, in the examples of the present invention herein before described, the Nickel Oxide provides the first component 80 of the composite layer 30 and the Nickel Hydroxide provides the second component 70 of the composite layer 30. However, in other embodiments of the present invention, the first component 80 and the second component (70) may be provided by other oxides, or alternatively by fluorides, chlorides, iodides, sulphides or hydroxides, or alternatively by sulphites, sulphates, and carbonates. Other suitable compositions will be apparent to those skilled in the art. The present invention also extends to arrangement in which the second component 70 comprises vacancies in the first component 80.

In the example of the present invention herein before described with reference to FIG. 3, Hydroxide depletion was achieved by exposing the surface of the composite layer 30 to an oxygen plasma. However, in other embodiments of the present invention, an analogous effect may be achieved by eliminating the component having the lower ionisation potential from the region 90 through the use of a selective etchant. For example, in a device comprising a composite layer 30 of Nickel Oxide and Nickel Carbonate or Nickel Phosphate, such an etchant may be employed to deplete the Nickel Carbonate or Nickel Phosphate from the region 90 adjacent to the organic layer 50. Additionally, fluoridation, iodination, or oxygenation of a more insulating material of higher ionisation potential can be optionally performed to enhance the conductivity of the material.

In some embodiments of the present invention, the composite layer 30 may be deposited as a film on the conductive layer 20. However, in other embodiments of the present invention, the composite layer 30 may be fabricated by modification of the conductive layer 20 via techniques such as exposure to oxygen plasma, X-ray radiation, ozone exposure, dry chemical etching, and the like. The ratio of the first component 80 to the second component 70 in the composite layer 30 can be set by techniques such as oxygen plasma, UV-ozone, X ray irradiation, ion implantation, wet chemical processing and the like.

Embodiments of the present invention have been described in which the performance of an electrode is enhanced by forming the electrode 40 from a conductive layer 20 and a composite layer 30. The composite layer 30 comprising an insulating material having a relatively high energy level intermixed or doped with an at least partially conducting inorganic material. In some embodiment of the present invention, the composite layer 30 may include silicon dioxide, silicon nitrite or the like doped with an at least partially conducting material.

Figure 4:
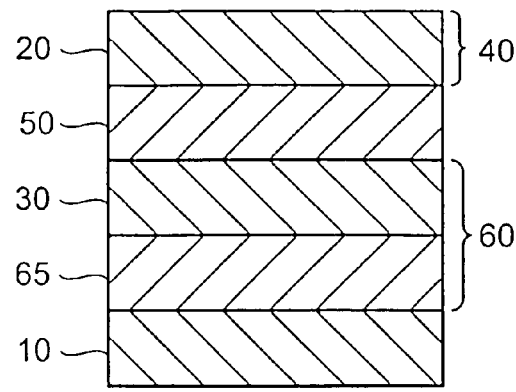
FIG. 4 is a cross sectional view of another example of an OLED embodying the present invention.
Figure 5:
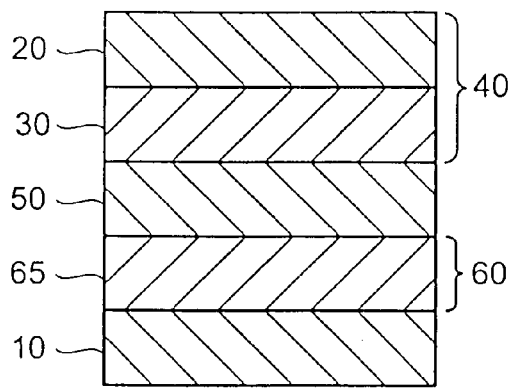
FIG. 5 is a cross sectional view of yet another example of an OLED embodying the present invention.
Figure 6:
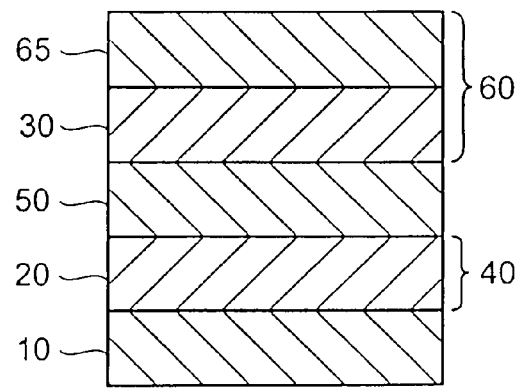
FIG. 6 is a cross sectional view of a further example of an OLED embodying the present invention.

In the preferred embodiments of the present invention herein before described, electrodes according to the present invention are employed as anodes for a organic light emitting diode. When employed as an anode, electrodes according to the present invention achieved especially desirable results when the composite layer 30 has a work function greater than 4 eV, a resistivity lower than 1000 gigaohm-meters, and a grain length greater than 1 nanometer. However, in other embodiment of the present invention, electrodes according to the present invention may also be employed as cathodes. For example, referring now to FIG. 4, in another embodiment of the present invention, the cathode 60 is provided by the composite layer 30 and the conductive layer 65 and the anode 40 is provided by the conductive layer 20. The cathode 60 is disposed between the organic layer 50 and the substrate 10 and the anode 20 is disposed on the side of the organic layer 50 remote from the substrate. It will be appreciated that many other arrangements embodying the present invention are possible. For example, with reference to FIG. 5, in another embodiment of the present invention, the cathode 60 is provided by the conductive layer 65 and the anode 40 is provided by the conductive layer 20 and the composite layer 30. The cathode 60 is disposed between the substrate 10 and the organic layer 50 and the anode 40 is disposed on the side of the organic layer 50 remote from the substrate 10. Referring now to FIG. 6, in yet another arrangement embodying the present invention, the cathode 60 comprises the composite layer 30 and the conductive layer 65 and the anode 40 comprises the conductive layer 20. The anode 40 is disposed between the organic layer and the substrate 10; and, the organic layer 50 is disposed between the cathode 60 and the anode 20.

Introduction of the composite layer allows the conductive layers to be optimised for device performance. For example, in the FIG. 6 arrangement, in the interests of enhancing performance and/or contrast, the anode 40 may be made highly reflective through use of high reflectivity materials such as Silver and Aluminium for the anode or highly absorbent through the use of high absorption material such as graphite for the anode.

Figure 7:
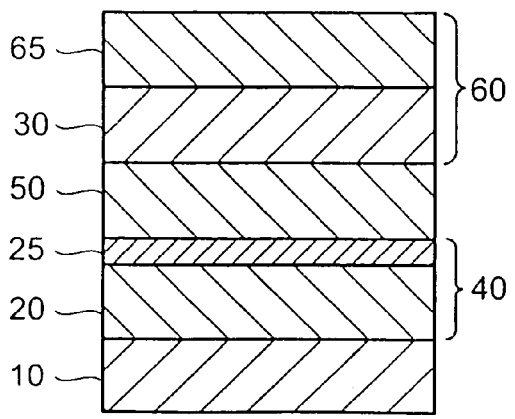
FIG. 7 is a cross sectional view of another example of an OLED embodying the present invention.
Figure 8:
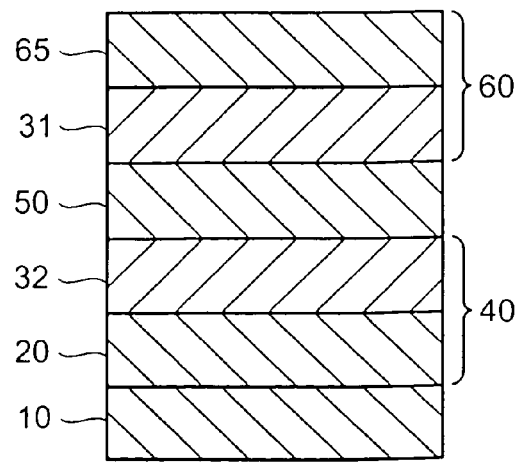
FIG. 8 is a cross sectional view of yet another example of an OLED embodying the present invention; and, FIG. 9 is a cross sectional view of another example of an OLED embodying the present invention.
Figure 9:
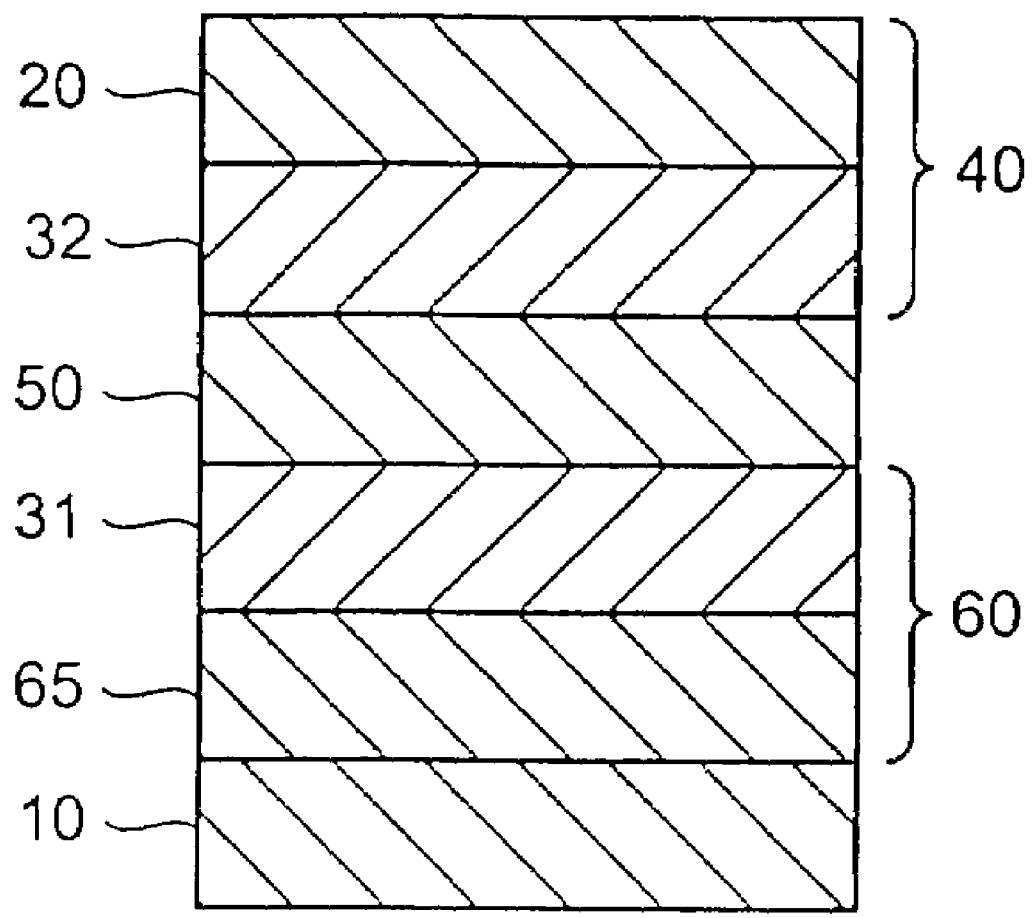

Referring now to FIG. 7, in a modification to the FIG. 6 arrangement, a performance enhancing layer 25 is disposed between the organic layer 50 and the anode 40. The performance enhancing layer may be highly reflective or highly absorbent as herein before described. Referring now to FIG. 8, in yet another arrangement embodying the present invention, the cathode 60 comprises a composite layer 31 and the anode 40 comprises a composite layer 32. In the cathode 60, the composite layer 31 is disposed between the conductor 65 and the organic layer 50. Similarly, in the anode 40, the composite layer 32 is disposed between the organic layer 50 and the conductor 20. With reference to FIG. 9, in a modification of the FIG. 8 arrangement, the positions of the anode 40 and cathode 60 relatively to the substrate 10 are interchanged.

Embodiments of the present invention have been herein before described with reference to an OLED. However, it will be appreciated that the present invention is not limited to OLED applications and organic layers sandwiched between two electrodes, but instead extends to other devices both within and outside the display field.

The invention claimed is:

1. An electrode comprising an inorganic composite layer of a mixture of at least one insulating inorganic material and at least one partially conducting inorganic material, the or each insulating material being a sulphate, and the or each partially conducting material being a sulphate, wherein the composite layer has a resistivity lower than 1000 Gigaohm-metres.

2. An electrode as claimed in claim 1, wherein the composite layer has an average work function greater than 4 eV.

3. A electrode as claimed in claim 1, wherein the composite layer has an average work function less than 4 eV.

4. An electrode as claimed in claim 1, wherein the grain length of the materials of the composite layer is greater than 1 nanometre.

5. A device comprising a substrate and an electrode as claimed in claim 4.

6. An electrode as claimed in claim 1, further comprising a conductive layer.

7. An electrode as claimed in claim 6, wherein the conductive layer comprises any of Nickel, Tungsten, Silicon, Molybdenum, Cobalt, Silver, Aluminium, and Graphite.

8. An electrode as claimed in claim 6, wherein the conductive layer comprises a light reflective surface.

9. An electrode as claimed in claim 6, wherein the conductive layer comprises a light absorbent surface.

10. An organic electroluminescent device comprising: first and second conductor layers; an organic layer disposed between the first and second conductor layers; a performance enhancing layer disposed between the second conductor layer and the organic layer; a composite layer disposed between the organic layer and the first conductor layer; the composite layer comprising a mixture of at least one insulating inorganic material and at least one at least partially conducting inorganic material; and a substrate, the first conductor layer being disposed between the substrate and the organic layer; wherein the first conductor layer forms part of a cathode, wherein the composite layer has a resistivity lower than 1000 Gigaohm-metres.

11. A device as claimed in claim 10, further comprising a performance enhancing layer disposed between the first conductor layer and the organic layer.

12. An organic electroluminescent device comprising: a first and second conductor layers; an organic layer disposed between the first and second conductor layers; a first composite layer disposed between the organic layer and the first conductor layer; and a second composite layer disposed between the organic layer and the second conductor layer, the first and second composite layers each comprising a mixture of at least one insulating inorganic material and at least one at least partially conducting inorganic material, wherein the composite layer has a resistivity lower than 1000 Gigaohm-metres.

13. A device as claimed in claim 12, comprising a performance enhancing layer disposed between the first conductor layer and the organic layer.

14. A device as claimed in claim 13 wherein the performance enhancing layer comprises a light absorbent surface.

15. A device as claimed in claim 13 wherein the performance enhancing layer comprises a light reflective surface.

16. A device as claimed in any one of claims 12 to 15, wherein the first conductor layer forms part of an anode.

17. A device as claimed in any one of claims 12 to 15 wherein the first conductor layer forms part of a cathode.

18. A device as claimed in claim 12 wherein the or each insulating material is an oxide, fluoride, chloride, bromide, iodides, sulphide, hydroxide, sulphite, sulphate, or carbonate.

19. A device as claimed in claim 12 wherein the or each at least partially conducting material is an oxide, fluoride, chloride, bromide, iodides, sulphide, hydroxide, sulphite, sulphate, or carbonate.

20. A device as claimed in claim 12 wherein the or each composite layer has an average work function greater than 4 eV.

21. A device as claimed in claim 12 wherein the or each composite layer has an average work function less than 4 eV.

22. A device as claimed in claim 12 wherein the grain length of the materials of the or each composite layer is greater than 1 nanometre.

23. A device as claimed in claim 12 wherein the or each composite layer comprises a region adjacent to the organic layer in which region the at least partially conducting material is depleted.

24. An electrode comprising an inorganic composite layer of a mixture of nickel hydroxide and nickel oxide, wherein the composite layer has a resistivity lower than 1000 Gigaohm-metres.

25. The electrode as claimed in claim 24, wherein the composite layer has an average work function greater than 4 eV.

26. The electrode as claimed in claim 24, wherein the composite layer has an average work function less than 4 eV.

27. An electrode comprising an inorganic composite layer of a mixture of nickel hydroxide and nickel oxide, wherein the grain length of the materials of the composite layer is greater than 1 nanometre.

28. The electrode as claimed in claim 27, wherein the composite layer has an average work function greater than 4 eV.

29. The electrode as claimed in claim 27, wherein the composite layer has an average work function less than 4 eV.

30. The electrode as claimed in claim 27, further comprising a conductive layer, wherein the conductive layer comprises a light absorbent surface.

31. An electrode comprising an inorganic composite layer of a mixture of at least one insulating inorganic material and at least a first partially conducting inorganic material, the or each insulating material being a sulphide, sulphite, sulphate or carbonate, and the or each partially conducting material being a sulphide, suiphite, sulphate or carbonate, wherein the composite layer further comprises silicon dioxide or silicon nitrite, wherein the silicon dioxide or silicon nitrite is doped with a second at least partially conducting material, wherein the composite layer has a resistivity lower than 1000 Gigaohm-metres.

32. An electrode comprising an inorganic composite layer of a mixture of at least one insulating inorganic material and at least one partially conducting inorganic material, the or each insulating material being a sulphite, sulphate or carbonate, and the or each partially conducting material being a sulphite, sulphate or carbonate, wherein the composite layer has a resistivity lower than 1000 Gigaohm-metres.

33. An electrode comprising an inorganic composite layer of a mixture of at least one insulating inorganic material and at least one partially conducting inorganic material, the or each insulating material being a sulphite, sulphate or carbonate, and the or each partially conducting material being a sulphite, sulphate or carbonate, wherein the grain length of the materials of the composite layer is greater than 1 nanometre, wherein the composite layer has a resistivity lower than 1000 Gigaohm-metres.

34. An electrode comprising:
a conductive layer;
an inorganic composite layer of a mixture of nickel hydroxide and nickel oxide on said conducting layer, and an insulating layer of lithium fluoride or vanadium oxide on said composite layer.

* * * * *